United States Patent
Yasui et al.

(10) Patent No.: US 10,682,792 B2
(45) Date of Patent: Jun. 16, 2020

(54) MOLD DEVICE

(71) Applicant: Mitsubishi Electric Corporation, Tokyo (JP)

(72) Inventors: Takatoshi Yasui, Tokyo (JP); Yuki Hata, Tokyo (JP); Shoji Saito, Tokyo (JP); Katsuji Ando, Fukuoka (JP); Korehide Okamoto, Fukuoka (JP); Ryoji Murai, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 322 days.

(21) Appl. No.: 15/575,345

(22) PCT Filed: Jul. 30, 2015

(86) PCT No.: PCT/JP2015/071640
§ 371 (c)(1),
(2) Date: Nov. 18, 2017

(87) PCT Pub. No.: WO2017/017837
PCT Pub. Date: Feb. 2, 2017

(65) Prior Publication Data
US 2018/0147758 A1    May 31, 2018

(51) Int. Cl.
*B29C 45/14*    (2006.01)
*H01L 21/56*    (2006.01)
(Continued)

(52) U.S. Cl.
CPC .. *B29C 45/14065* (2013.01); *B29C 45/14467* (2013.01); *B29C 45/14639* (2013.01);
(Continued)

(58) Field of Classification Search
CPC ........ B29C 45/14065; B29C 45/14467; B29C 45/14639; B29C 45/14836;
(Continued)

(56) References Cited

U.S. PATENT DOCUMENTS 7,336,469 B2    2/2008    Takanashi
2002/0190374 A1*    12/2002    Nakajima ............. H01L 21/565
                                                        257/707
(Continued)

FOREIGN PATENT DOCUMENTS

CN    202480314 U  *  10/2012
JP    S62-173912 U    11/1987
(Continued)

OTHER PUBLICATIONS

Partial machine translation of CN 202480314 U dated Oct. 2012 obtained from the espace website. (Year: 2012).*
(Continued)

*Primary Examiner* — Robert B Davis
(74) *Attorney, Agent, or Firm* — Studebaker & Brackett PC (57)    ABSTRACT

The mold device according to the present invention is a mold device to resin-seal the semiconductor device including an insert electrode, and in the semiconductor device, the insert electrode is provided with an insert hole, a nut having a screw hole is disposed in the insert electrode so that the insert hole and the screw hole communicate with each other, the mold device includes a mold body into which resin is injected to resin-seal the semiconductor device, including a side of the insert electrode where the nut is disposed, and a rod-like member that is inserted into the insert hole, and the rod-like member is inserted into the screw hole of the nut through the insert hole of the insert electrode to draw the nut to the side of the insert electrode.

9 Claims, 8 Drawing Sheets

(51) Int. Cl.
  *H01L 23/48* (2006.01)
  *B29L 1/00* (2006.01)
  *B29L 31/34* (2006.01)
  *H01L 21/67* (2006.01)

(52) U.S. Cl.
  CPC ........ *B29C 45/14836* (2013.01); *H01L 21/56* (2013.01); *H01L 21/565* (2013.01); *H01L 23/48* (2013.01); *B29C 45/14418* (2013.01); *B29C 2045/14131* (2013.01); *B29L 2001/00* (2013.01); *B29L 2031/3406* (2013.01); *H01L 21/67126* (2013.01)

(58) Field of Classification Search
  CPC .... B29C 45/14418; B29C 2045/14131; H01L 21/565
  USPC .......................................................... 249/93
  See application file for complete search history.

(56) References Cited

U.S. PATENT DOCUMENTS

| | | | |
|---|---|---|---|
| 2003/0180498 A1* | 9/2003 | De Winter | B29C 45/14065 428/67 |
| 2005/0218558 A1* | 10/2005 | Asao | B29C 45/14065 264/272.11 |
| 2007/0026744 A1 | 2/2007 | Takanashi | |
| 2012/0168246 A1* | 7/2012 | Kondo | F02B 77/13 181/284 |
| 2016/0361851 A1* | 12/2016 | Lin | B29C 45/14008 |

FOREIGN PATENT DOCUMENTS

| | | |
|---|---|---|
| JP | 01-272419 A | 10/1989 |
| JP | 02-055108 A | 2/1990 |
| JP | 06-012024 U | 2/1994 |
| JP | 06-091657 A | 4/1994 |
| JP | 2007-038441 A | 2/2007 |
| JP | 2012-148448 A | 8/2012 |
| JP | 2012-232430 A | 11/2012 |

OTHER PUBLICATIONS

An Office Action issued by the Japanese Patent Office dated Feb. 6, 2018, which corresponds to Japanese Patent Application No. 2017-530563 and is related to U.S. Appl. No. 15/575,345; with English translation.
An Office Action issued by the Chinese Patent Office dated Sep. 25, 2019, which corresponds to Chinese Patent Application No. 201580082090.6 and is related to U.S. Appl. No. 15/575,345.
International Search Report issued in PCT/JP2015/071640; dated Oct. 20, 2015.
Notification Concerning Transmittal of International Preliminary Report on Patentability (Chapter I) and Translation of Written Opinion of the International Searching Authority; PCT/JP2015/071640; dated Feb. 8, 2018.

* cited by examiner

MOLD DEVICE

TECHNICAL FIELD

The present invention relates to a mold device, and particularly to a mold device for use in resin-sealing a semiconductor device including an insert electrode.

BACKGROUND ART

As one of conventional housings for semiconductor devices each including an insert nut, there has been a housing in which a nut for insert and an electrode for insert are incorporated in a mold. In a molding method using this technique, if there is even a small gap between the electrode and the nut at the time of molding, resin enters the gap, so that wraparound of the resin occurs after the molding. The wraparound of the resin between the electrode and the nut causes resin creep at the time of bolt tightening, so that there is a concern that a decrease in axial force during use or immediately after the tightening is caused. There is a possibility that the decrease in axial force largely impairs assumed quality, and prevention of the resin wraparound is a very important factor on molding.

Therefore, when the mold, the nut, and the housing at the time of molding are designed, dimensions and tolerances for eliminating the gap between the electrode and the nut need to be set. Since performance of respective members, variation in molding conditions and the like need to be considered, controlling the wraparound only by dimensional design is at a very high difficulty level, and for this, experience and technique are required.

Moreover, when the insert nut is made of a magnetic body such as iron and the like, there has been known a method in which a magnet is provided on a movable mold side, and the insert nut is attracted to the magnet, by which opposed end surfaces of a head portion of a pin member and the insert nut are caused to closely adhere to thereby prevent inflow of melted resin between both (Patent Document 1). Moreover, there has been known a method for obtaining a similar effect by using an electromagnet in place of this magnet (Patent Document 2). Moreover, there has been known a method for providing a magnetic force for a pin for guide or the like in place of a mold (Patent Document 3). However, in the case where a permanent magnet is brought into contact with the mold or the pin for guide to attract the insert nut, there is a concern that the magnetic force is lost due to a high temperature during the molding, and that constant quality cannot be maintained. Moreover, in the electromagnetization as well, necessity for securing a space due to a power supply additionally provided, and deterioration in cost of electricity are supposed, so that the current state is that the magnetization cannot be easily utilized or introduced.

PRIOR ART DOCUMENTS

Patent Documents

Patent Document 1: Japanese Patent Application Laid-Open No. 2012-232430

Patent Document 2: Japanese Patent Application Laid-Open No. 06-91657 (1994)

Patent Document 3: Japanese Patent Application Laid-Open No. 2012-148448

SUMMARY

Problems to be Solved by the Invention

When a mold, a nut, and a housing at the time of molding are designed, dimensions and tolerances for eliminating a gap between an electrode and the nut need to be set. Since variation in dimensions of respective members, molding conditions and the like need to be considered, controlling the wraparound of resin only by dimensional design is at a very high difficulty level, and for this, experience and technique are required. While the method of using a magnet in the related art has been proposed, this technique may be difficult to use in view of costs, a facility, and quality management.

Accordingly, establishment of a housing molding method is needed, in which without performing advanced design, the difficulty level of the costs, the facility, the quality management are considered, the tolerances of respective members are taken account of, and the quality management can be simplified.

The present invention is achieved to solve the above-described problems, and an object of the present invention is to provide a mold device having a simple structure that suppresses entrance of resin between an insert electrode and a nut when resin sealing of a semiconductor device is performed.

Means to Solve the Problems

A mold device according to the present invention is a mold device to resin-seal a semiconductor device including an insert electrode, wherein in the semiconductor device, the insert electrode is provided with an insert hole, and a nut having a screw hole is disposed in the insert electrode so that the insert hole and the screw hole communicate with each other, the mold device includes a mold body into which resin is injected to resin-seal the semiconductor device, including a side of the insert electrode where the nut is disposed, and a rod-like member that is inserted into the insert hole, and the rod-like member is inserted into the screw hole of the nut through the insert hole of the insert electrode to draw the nut to the side of the insert electrode.

Moreover, a mold device according to the present invention is a mold device to resin-seal a semiconductor device including an insert electrode, wherein in the semiconductor device, the insert electrode is provided with an insert hole, and a nut having a screw hole is disposed in the insert electrode so that the insert hole and the screw hole communicate with each other, the mold device includes a mold body into which resin is injected to resin-seal the semiconductor device, including a side of the insert electrode where the nut is disposed, and a slide mold disposed on an inner side of the insert electrode, the mold body includes a protrusion, the protrusion is inserted into the screw hole of the nut through the insert hole of the insert electrode, the slide mold includes first and second molds, in the respective first and second molds, a pair of cutouts is provided, and the pair of cutouts encloses an outer periphery of a bearing surface of the nut.

Moreover, a mold device according to the present invention is a mold device to resin-seal a semiconductor device including an insert electrode, wherein in the semiconductor device, the insert electrode is provided with an insert hole, and a nut having a screw hole is disposed in the insert electrode so that the insert hole and the screw hole communicate with each other, the mold device includes a mold body into which resin is injected to resin-seal the semiconductor device, including a side of the insert electrode where the nut is disposed, and a protrusion provided in the mold body, the protrusion is inserted into the screw hole of the nut through the insert hole of the insert electrode, and the protrusion is provided with an adsorption passage that adsorbs the nut by a negative pressure to draw the nut to the side of the insert electrode.

Effects of the Invention

In the mold device according to the present invention, before the resin is injected into the mold body, the nut is drawn by the rod-like member to the side of the insert electrode through the insert hole. This causes the insert electrode and the nut to closely adhere without any gap. That is, with the simple structure, a gap which the resin enters can be restrained from occurring between the nut and the inner side of the insert electrode.

Moreover, in the mold device according to the present invention, when the resin is injected into the mold body, the cutouts provided in the first and second molds enclose the outer periphery of the bearing surface of the nut. This allows the resin to be dammed by the first and second molds when the resin sealing is performed, and with the simple structure, a gap which the resin enters can be restrained from occurring between the insert electrode and the bearing surface of the nut.

Moreover, in the mold device according to the present invention, when the resin is injected into the mold body, the nut is adsorbed by the adsorption passage with the insert electrode interposed. Adsorbing the nut allows the nut to be drawn to the side of the insert electrode, and causes the insert electrode and the nut to closely adhere without any gap. That is, with the simple structure, a gap which the resin enters can be restrained from occurring between the nut and the inner side of the insert electrode.

An object, characteristics, aspects, and advantages of the present invention will become clearer through the following detailed description and the accompanying drawings.

DESCRIPTION OF EMBODIMENTS

Embodiment 1

Figure 1:
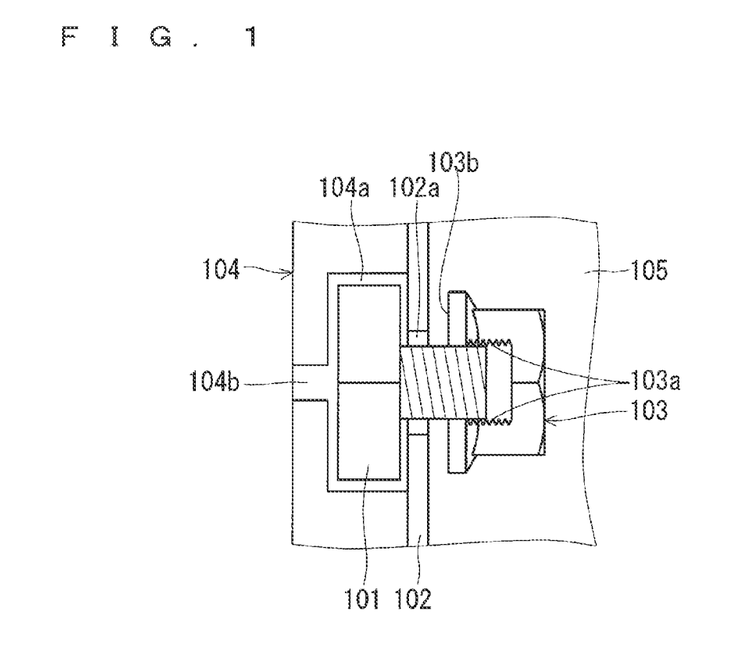
FIG. 1 is a cross-sectional view in the middle of assembly of a mold device according to a first embodiment.
Figure 2:
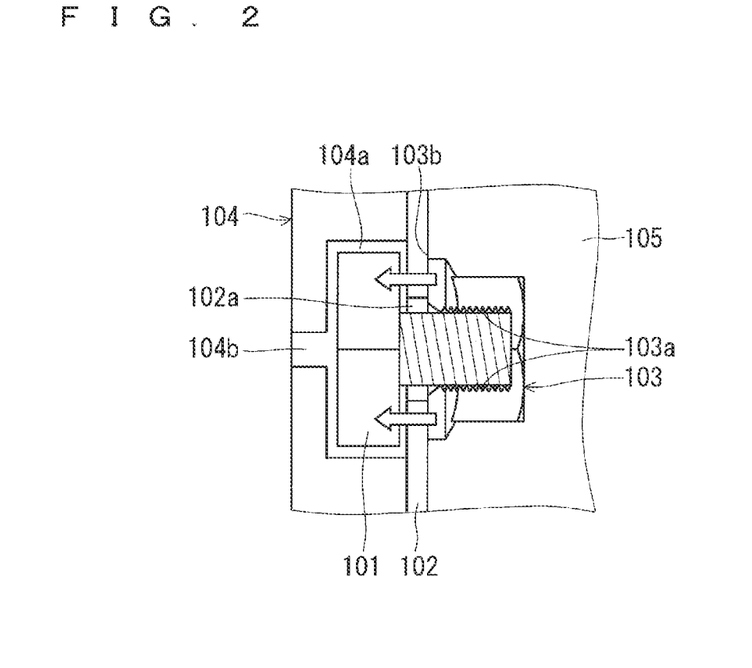
FIG. 2 is a cross-sectional view of the mold device according to the first embodiment.

FIG. 1 is a cross-sectional view in the middle of assembly of a mold device in the present first embodiment. FIG. 2 is a cross-sectional view of the mold device in the present first embodiment.

The mold device in the present first embodiment is a mold device to resin-seal a semiconductor device including an insert electrode 102. As shown in FIG. 1, the insert electrode 102 is provided with an insert hole 102a. In the insert electrode 102, a nut 103 having a screw hole 103a is disposed. The nut 103 is disposed so that the insert hole 102a and the screw hole 103a communicate with each other.

The mold device in the present first embodiment includes a mold body 104 into which resin is injected to resin-seal the semiconductor device, including a side of the insert electrode 102 where the nut 103 is disposed, and a rod-like member (i.e., a bolt 101) that is inserted into the insert hole 102a.

The mold body 104 is provided with a recession 104a to receive a head portion of the bolt 101. Moreover, a through hole 104b is provided at a bottom of the recession 104a. The head portion of the bolt 101 is provided with, for example, a hexagon socket. In a state where the head portion of the bolt 101 is fitted in the recession 104a of the mold body 104, the bolt 101 can be rotated with a hexagon wrench key or the like through the through hole 104b from an outer side of the mold body 104.

Hereinafter, a method for using the mold device in the present first embodiment will be described. First, the head portion of the bolt 101 is fitted in the recession 104a of the mold body 104 to be received therein. The insert electrode 102 is disposed in the mold body 104. At this time, the insert electrode 102 is disposed so that a shaft portion of the bolt 101 penetrates the insert hole 102a of the insert electrode 102.

Next, the shaft portion of the bolt 101 is screwed into the screw hole 103a of the nut 103 while the bolt 101 is rotated. At this time, tightening the nut 103 with the bolt 101 allows the nut 103 to be drawn to a side of the insert electrode 102. That is, the nut 103 is drawn in an arrow direction in FIG. 2. As a result, an abutting surface 103b of the nut 103 is caused to closely adhere to an inner side of the insert electrode 102 without any gap. When the nut 103 and the bolt 101 are screwed, the bolt 101 may be rotated instead of the nut 103.

The resin is injected into a cavity 105 of the mold body 104 to resin-seal the semiconductor device. After the resin is cured, the bolt 101 is rotated to separate the resin-sealed insert electrode 102 and nut 103 from the mold body 104. By the above-described process, the resin-sealed semiconductor device is obtained.

While in the present first embodiment, the bolt 101 and the nut 103 are tightened with the insert electrode 102 interposed after the head portion of the bolt 101 is received in the recession 104a of the mold body 104, the head portion of the bolt 101 may be received in the recession 104a of the mold body 104 after the bolt 101 and the nut 103 are tightened with the insert electrode 102 interposed. In this case, after the resin sealing is performed, the semiconductor device is taken out from the mold body 104 with the bolt 101 tightened with respect to the nut 103, and then, the bolt 101 is taken out from the nut 103. In this case, the through hole 104b does not necessarily need to be provided at the bottom of the recession 104a.

<Effects>

The mold device in the present first embodiment is a mold device to resin-seal the semiconductor device including the insert electrode 102, and in the semiconductor device, the insert electrode 102 is provided with the insert hole 102a, the nut 103 having the screw hole 103a is disposed in the insert electrode 102 so that the insert hole 102a and the screw hole 103a communicate with each other, the mold device includes the mold body 104 into which the resin is injected to resin-seal the semiconductor device, including the side of the insert electrode 102 where the nut 103 is disposed, and the rod-like member (i.e., the bolt 101) that is inserted into the insert hole 102a, and the rod-like member is inserted into the screw hole 103a of the nut 103 through the insert hole 102a of the insert electrode 102 to draw the nut 103 to the side of the insert electrode 102.

In the present first embodiment, before the resin is injected into the mold body 104, the nut 103 is drawn to the side of the insert electrode 102 through insert hole 102a by the rod-like member. This allows the insert electrode 102 and the nut 103 to closely adhere without any gap. That is, a gap which the resin enters can be restrained from occurring between the nut 103 and the inner side of the insert electrode 102.

Moreover, in the mold device in the present first embodiment, the rod-like member is the bolt 101, and by screwing the bolt 101 into the screw hole 103a of the nut 103 through the insert hole 102a, the nut 103 is drawn to the side of the insert electrode 102.

In the present first embodiment, before the resin is injected into the mold body 104, the nut 103 is tightened by the bolt 101 with the insert electrode 102 interposed. This causes the insert electrode 102 and the nut 103 to closely adhere without any gap. That is, a gap which the resin enters can be restrained from occurring between the nut 103 and the inner side of the insert electrode 102.

Moreover, the mold device in the present first embodiment is a mold device to resin-seal the semiconductor device including the insert electrode 102, and in the semiconductor device, the insert electrode 102 is provided with the insert hole 102a, the nut 103 having the screw hole 103a is disposed in the insert electrode 102 so that the insert hole 102a and the screw hole 103a communicate with each other, the mold device includes the mold body 104 into which the resin is injected to resin-seal the semiconductor device, including the side of the insert electrode 102 where the nut 103 is disposed, and the mold body 104 is provided with the recession 104a to receive the head portion of the bolt 101 that is screwed into the screw hole 103a of the nut 103 through the insert hole 102a.

In the present first embodiment, in the mold body 104, the recession 104a to receive the head portion of the bolt 101 is provided. This enables the insert electrode 102 and the nut 103 to be disposed in the mold body 104 in the state where the nut 103 is tightened by the bolt 101 through the insert hole 102a. Thus, since the insert electrode 102 and the nut 103 closely adhere without any gap, a gap which the resin enters is restrained from occurring between the nut 103 and the inner side of the insert electrode 102.

Embodiment 2

Figure 3:
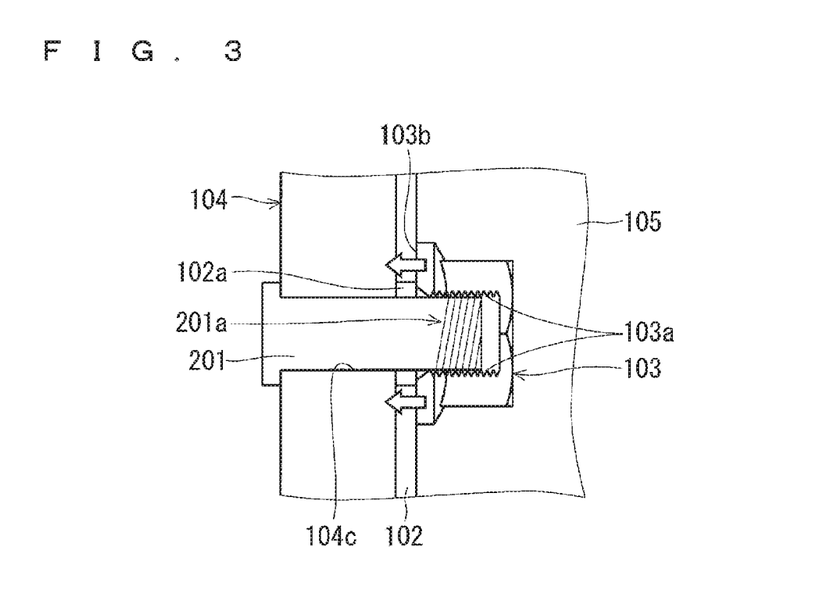
FIG. 3 is a cross-sectional view of a mold device according to a second embodiment.

FIG. 3 is a cross-sectional view of a mold device in the present second embodiment. While in the first embodiment, the bolt 101 is employed as the rod-like member, in the present second embodiment, a pilot pin 201 is employed as a rod-like member. A screw thread 201a is formed in a leading end portion of the pilot pin 201. Moreover, a recession to be fitted with a screwdriver is provided in a rear end portion of the pilot pin 201, so that the pilot pin 201 can be rotated with the screwdriver. A through hole 104c to pass the pilot pin 201 through is provided in a mold body 104.

Hereinafter, a method for using the mold device in the present second embodiment will be described. First, the pilot pin 201 is inserted into the through hole 104c of the mold body 104. An insert electrode 102 is disposed in the mold body 104 so that the pilot pin 201 is inserted into the insert hole 102a. The pilot pin 201 may be inserted into the through hole 104c of the mold body 104 after the insert electrode 102 is disposed into the mold body 104.

Next, the screw thread 201a at a leading end of the pilot pin 201 is screwed into a screw hole 103a of a nut 103. At this time, tightening the nut 103 with the pilot pin 201 allows the nut 103 to be drawn to a side of the insert electrode 102. That is, the nut 103 is drawn in an arrow direction in FIG. 3. As a result, an abutting surface 103b of the nut 103 is caused to closely adhere to an inner side of the insert electrode 102 without any gap. When the nut 103 and the pilot pin 201 are screwed, the pilot pin 201 may be rotated instead of the nut 103.

Resin is injected into a cavity 105 of the mold body 104 to resin-seal a semiconductor device. After the resin is cured, the pilot pin 201 is rotated to pull out the pilot pin 201 from the mold body 104. The resin-sealed insert electrode 102 and nut 103 are separated from the mold body 104. By the above-described process, the resin-sealed semiconductor device is obtained.

<Effects>

In the mold device in the present second embodiment, the rod-like member is the pilot pin 201, the screw thread 201a is provided at the leading end of the pilot pin 201, the screw thread 201a at the leading end of the pilot pin 201 is screwed into the screw hole 103a of the nut 103 through the insert hole 102a, by which the nut 103 is drawn to the side of the insert electrode 102.

In the present second embodiment, before the resin is injected into the mold body 104, the nut 103 is tightened by the pilot pin 201 having the screw thread 201a with the insert electrode 102 interposed. This allows the insert electrode 102 and the nut 103 to closely adhere without any gap. That is, a gap which the resin enters can be restrained from occurring between the nut 103 and the inner side of the insert electrode 102. Moreover, using the pilot pin 201 enables the insert electrode 102 and the nut 103 to be positioned. Further, using the pilot pin 201 can cause the nut 103 to closely adhere to the insert electrode 102 without, for example, damaging a surface of the insert electrode 102 on the pilot pin 201 side.

Embodiment 3

Figure 4:
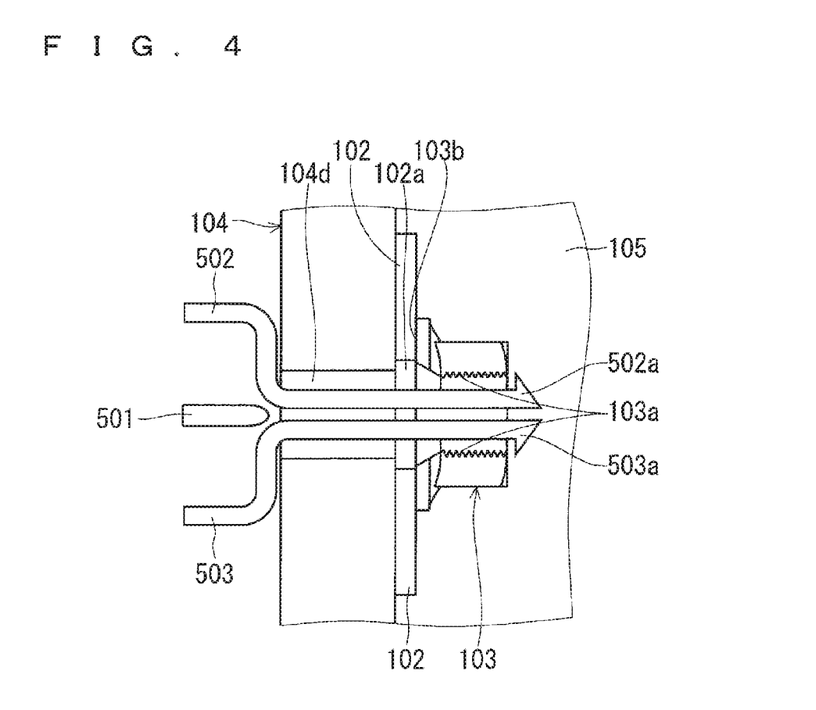
FIG. 4 is a cross-sectional view in the middle of assembly of a mold device according to a third embodiment.
Figure 5:
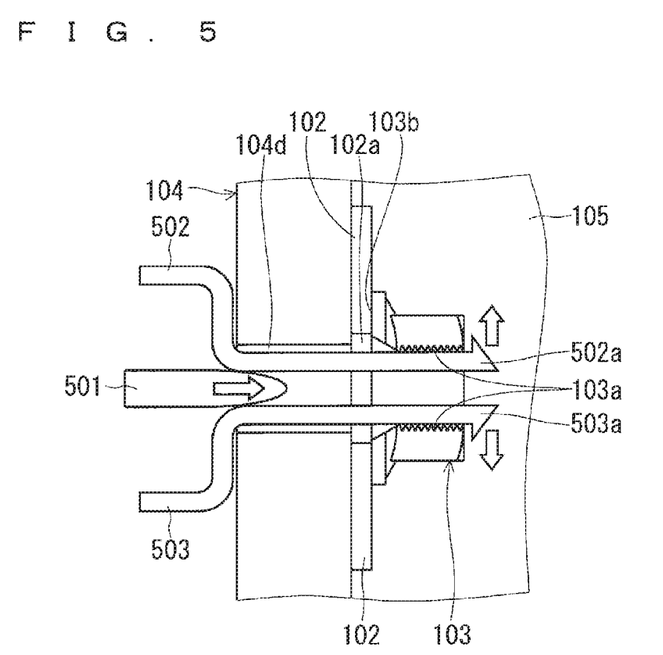
FIG. 5 is a cross-sectional view in the middle of the assembly of the mold device according to the third embodiment.
Figure 6:
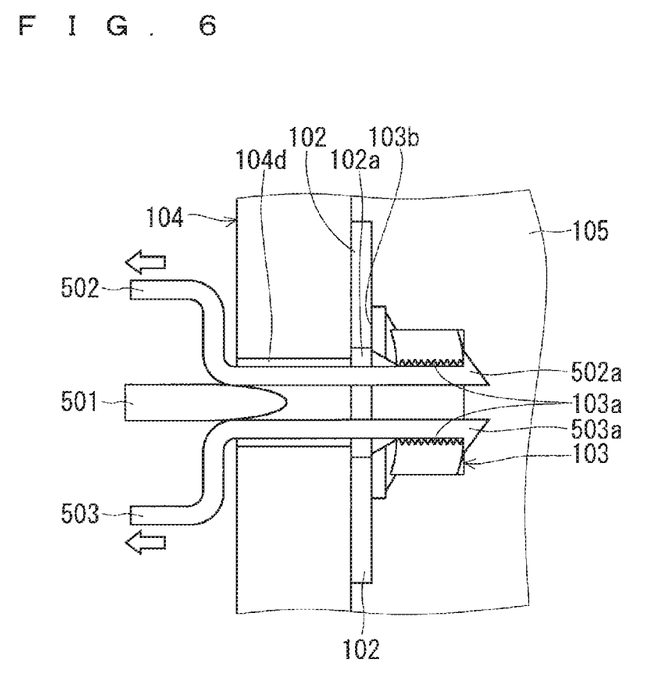
FIG. 6 is a cross-sectional view of the mold device according to the third embodiment.

FIGS. 4 and 5 are cross-sectional views in the middle of assembly of a mold device in the present third embodiment. FIG. 6 is a cross-sectional view of the mold device in the present third embodiment.

While in the second embodiment, the pilot pin 201 is employed as the rod-like member, in the present third embodiment, a plurality of pilot pins 502, 503 are employed as rod-like members. As shown in FIGS. 4 to 6, claws 502a, 503a are formed in respective leading end portions of the pilot pins 502, 503. A mold body 104 is provided with a through hole 104d to pass the pilot pins 502, 503 through. The mold device in the present third embodiment includes a pilot pin extension rod 501. A leading end of the pilot pin extension rod 501 is rounded. In the present third embodiment, a nut 103 is a penetration type nut (i.e., a nut with both ends of a screw hole 103a penetrated).

Hereinafter, a method for using the mold device in the present third embodiment will be described. First, as shown in FIG. 4, the pilot pins 502, 503 are inserted into the through hole 104d of the mold body 104. A surface on an opposite side of an abutting surface 103b of the nut 103 (i.e., a surface of the nut 103 on an opposite side of an entrance side from which the pilot pins 502, 503 are inserted) is locked by the respective claws 502a, 503a of the pilot pins 502, 503.

As shown in FIG. 5, the pilot pin extension rod 501 is pushed between the pilot pins 502, 503. This allows the pilot pins 502, 503 to be pressed to an inner wall of the screw hole 103a of the nut 103.

Further, the pilot pins 502, 503 are pulled in an arrow direction in FIG. 6 (an opposite direction of the nut 103). This allows the nut 103 locked by the claws 502a, 503a of the pilot pins 502, 503 to be drawn to a side of an insert electrode 102. As a result, the abutting surface 103b of the nut 103 is caused to closely adhere to an inner side of the insert electrode 102 without any gap.

Resin is injected into a cavity 105 of the mold body 104 to resin-seal a semiconductor device. After the resin is cured, the pilot pin extension rod 501 is pulled out from between the pilot pins 502, 503. Further, the pilot pins 502, 503 are pulled out from the screw hole 103a of the nut 103 and the through hole 104d of the mold body 104. The resin-sealed insert electrode 102 and nut 103 are separated from the mold body 104. By the above-described process, the resin-sealed semiconductor device is obtained.

While in the present third embodiment, the two pilot pins 502, 503 are employed, the number of pilot pins is not limited thereto, as long as it is plural.

<Effects>

In the mold device in the present third embodiment, the rod-like members are the plurality of pilot pins 502, 503, the claws 502a, 503a are provided at the respective leading ends of the plurality of pilot pins 502, 503, the pilot pin extension rod 501 is further included, in the state where the plurality of pilot pins 502, 503 are inserted into the screw hole 103a of the nut 103 through the insert hole 102a, the pilot pin extension rod 501 is inserted between the plurality of the pilot pins 502, 503, by which the claws 502a, 503a of the plurality of pilot pins 502, 503 are locked in the nut 103, and in the state where the claws 502a, 503a of the plurality of pilot pins 502, 503 are locked in the nut 103, the plurality of pilot pins 502, 503 draw the nut 103 to the side of the insert electrode 102.

In the present third embodiment, when the resin is injected into the mold body 104, the claws 502a, 503a provided at the leading ends of the plurality of pilot pins 502, 503 lock the nut 103 to pull the nut 103 in the direction where the nut 103 is pressed to the insert electrode 102. This causes the insert electrode 102 and the nut 103 to closely adhere without any gap. That is, a gap which the resin enters can be restrained from occurring between the nut 103 and the inner side of the insert electrode 102. Moreover, using the pilot pins 502, 503 enables the insert electrode 102 and the nut 103 to be positioned. Further, using the pilot pins 502, 503 can cause the nut 103 to closely adhere to the insert electrode 102 without, for example, damaging a surface of the insert electrode 102 on the pilot pin 201 side.

Moreover, in the mold device in the present third embodiment, the nut 103 is the nut 103 with both ends of the screw hole 103a penetrated, and the claws 502a, 503a of the pilot pins 502, 503 lock a surface of the nut 103 on an opposite side of an entrance side from which the pilot pins 502, 503 are inserted.

In the present third embodiment, the claws 502a, 503a provided at the leading ends of the plurality of pilot pins 502, 503 lock the surface of the nut 103 on the opposite side of the entrance side from which the pilot pins 502, 503 are inserted. This enables the nut 103 to be pulled in the direction where the nut 103 is pressed to the insert electrode 102.

Embodiment 4

Figure 7:
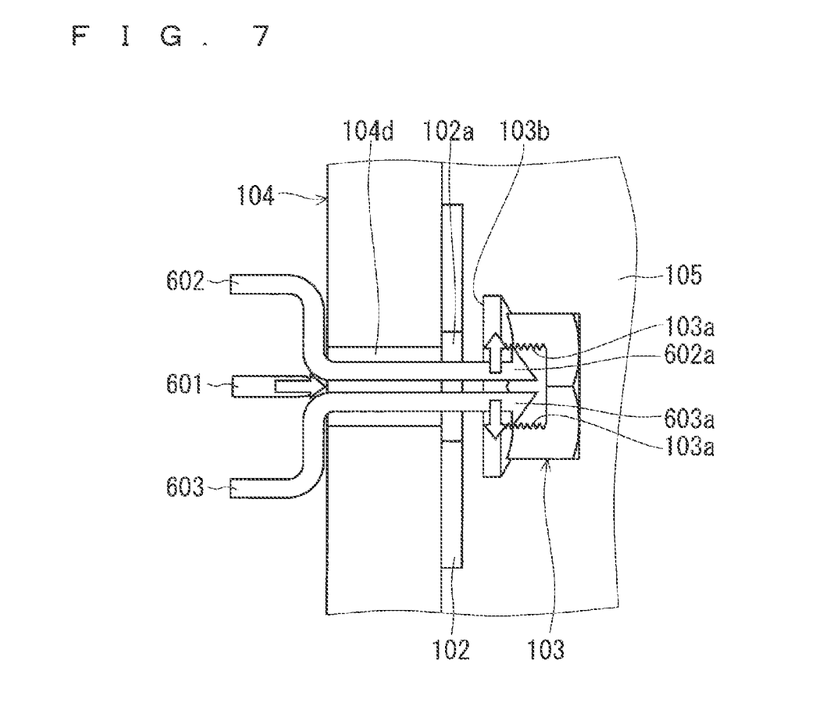
FIG. 7 is a cross-sectional view of a mold device according to a fourth embodiment.

FIG. 7 is a cross-sectional view of a mold device in the present fourth embodiment. While in the third embodiment, a penetration type nut is employed as the nut 103, in the present fourth embodiment, a cap nut (a non-penetration type nut) is employed. Similarly to the third embodiment, in the present fourth embodiment as well, a plurality of pilot pins 602, 603 are employed as rod-like members. As shown in FIG. 7, claws 602a, 603a are formed at respective leading end portions of the pilot pins 602, 603. A mold body 104 is provided with a through hole 104d to pass the pilot pins 602, 603 through. Moreover, the mold device in the present fourth embodiment includes a pilot pin extension rod 601. A leading end of the pilot pin extension rod 601 is rounded.

Hereinafter, a method for using the mold device in the present fourth embodiment will be described. First, as shown in FIG. 7, the pilot pins 602, 603 are inserted into the through hole 104d of the mold body 104. The claws 602a, 603a of the pilot pins 602, 603 are caused to abut on an inner wall of a screw hole 103a of a nut 103.

As shown in FIG. 7, the pilot pin extension rod 601 is pushed between the pilot pins 602, 603. This allows the claws 602a, 603a of the pilot pins 602, 603 to be pressed to the inner wall of the screw hole 103a of the nut 103. In this state, the claws 602a, 603a of the pilot pins 602, 603 are locked in a screw thread of the screw hole 103a of the nut 103.

Further, the pilot pins 602, 603 are pulled in an opposite direction of the nut 103. This allows the nut 103 locked by the claws 602a, 603a of the pilot pins 602, 603 to be drawn to a side of an insert electrode 102. As a result, an abutting surface 103b of the nut 103 is caused to closely adhere to an inner side of the insert electrode 102 without any gap.

Resin is injected into a cavity 105 of the mold body 104 to resin-seal a semiconductor device. After the resin is cured, the pilot pin extension rod 601 is pulled out from between the pilot pins 602, 603. Further, the pilot pins 602, 603 are pulled out from the screw hole 103a of the nut 103 and the through hole 104d of the mold body 104. The resin-sealed insert electrode 102 and nut 103 are separated from the mold body 104. By the above-described process, the resin-sealed semiconductor device is obtained.

While in the present fourth embodiment, the two pilot pins 602, 603 are employed, the number of pilot pins is not limited thereto, as long as it is plural.

The claws 602a, 603a provided at the leading ends of the pilot pins 602, 603 may have any shape that locks (catches) the screw thread. For example, leading ends of the claws 602a, 603a may be thinned to make it easy to be caught by the screw thread. A configuration may be employed in which a plurality of claws are included at the leading end of each of the pilot pins. Alternatively, for example, the claws may be formed of resin to exhibit elasticity. This allows the claws to go along a shape of the screw thread, which make it easy to bite the screw thread.

<Effects>

In the mold device in the present fourth embodiment, the nut 103 is a cap nut, and the claws 602a, 603a of the pilot pins 602, 603 lock the inner wall surface of the screw hole 103a of the nut 103.

In the present fourth embodiment, the claws 602a, 603a provided at the leading ends of the plurality of pilot pins 602, 603 lock the inner wall of the screw hole 103a of the nut 103. This enables the nut 103 to be pulled to a direction where the nut 103 is pressed to the insert electrode 102.

Embodiment 5

Figure 8:
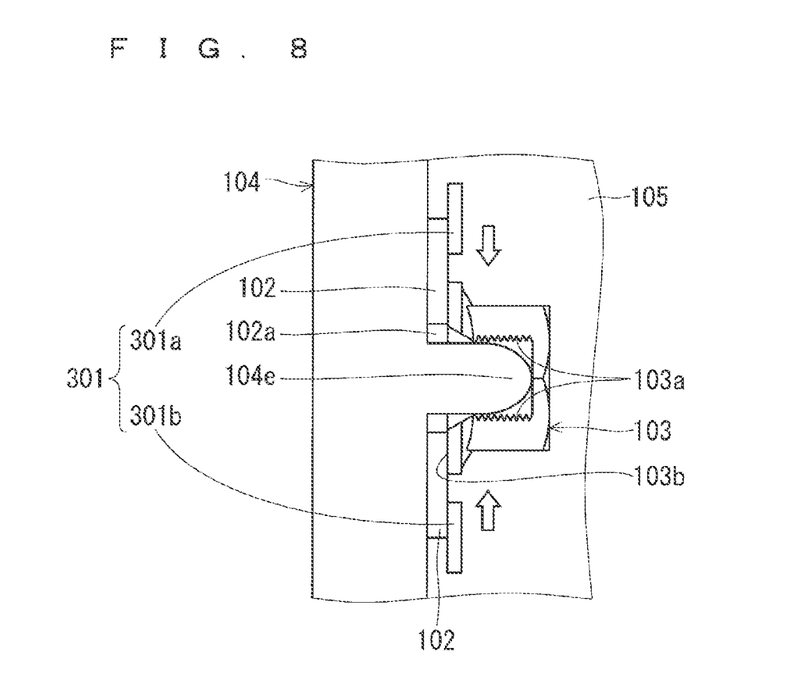
FIG. 8 is a cross-sectional view of a mold device according to a fifth embodiment.
Figure 9:
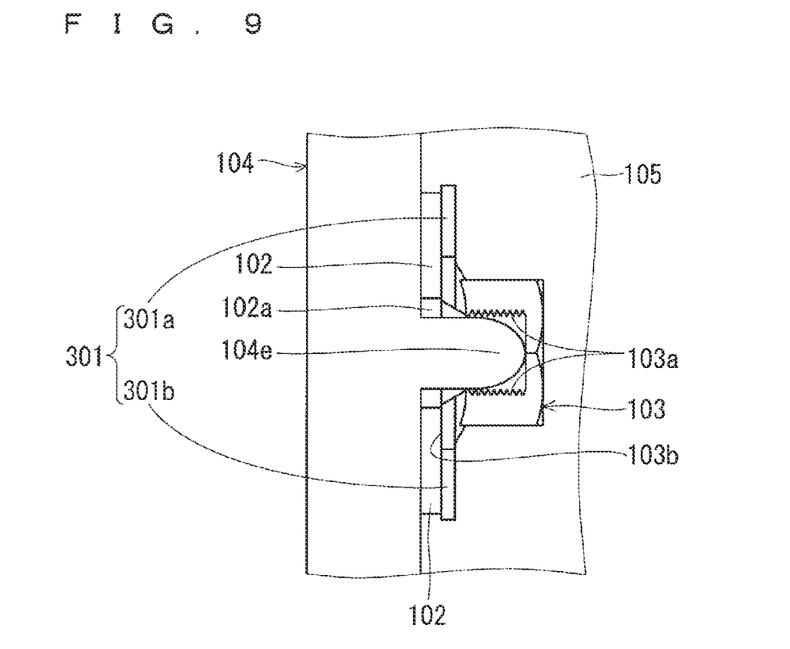
FIG. 9 is a cross-sectional view of the mold device according to the fifth embodiment.
Figure 10:
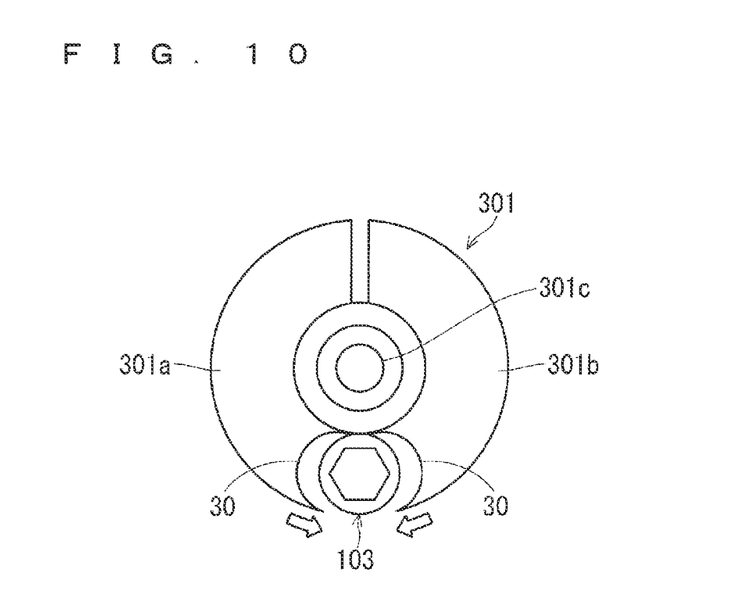
FIG. 10 is a plan view of a slide mold of the mold device according to the fifth embodiment.
Figure 11:
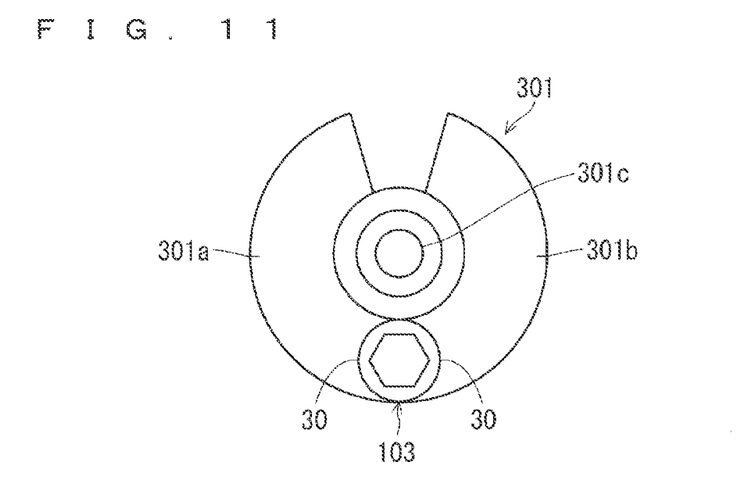
FIG. 11 is a plan view of the slide mold of the mold device according to the fifth embodiment.

FIGS. 8 and 9 are cross-sectional views of a mold device in the present fifth embodiment. Moreover, FIGS. 10 and 11 are plan views of a slide mold 301 in the present fifth embodiment.

The mold device in the present fifth embodiment is a mold device to resin-seal a semiconductor device including an insert electrode 102. As shown in FIGS. 8 and 9, the insert electrode 102 is provided with an insert hole 102a. In the insert electrode 102, a nut 103 having a screw hole 103a is disposed. The nut 103 is disposed so that the insert hole 102a and the screw hole 103a communicate with each other.

The mold device in the present fifth embodiment includes a mold body 104 into which resin is injected to resin-seal the semiconductor device, including a side of the insert electrode 102 where the nut 103 is disposed, and a slide mold 301 disposed on an inner side of the insert electrode 102. The mold body 104 is provided with a protrusion 104e.

The slide mold 301 includes first and second molds 301a, 301b. As shown in FIG. 10, a pair of cutouts 30 is provided in the first and second molds 301a, 301b. The first and second molds 301a, 301b have the same rotating shaft 301c. The first and second molds 301a, 301b rotate with respect to the rotating shaft 301c.

FIGS. 9 and 11 show a state where the pair of cutouts 30 encloses an outer periphery of a bearing surface (an abutting surface 103b) of the nut 103. In this state, inner sides of the pair of cutouts 30 abut on the outer periphery of the bearing surface of the nut 103. FIGS. 8 and 10 show a state where the pair of cutouts 30 releases the enclosure of the outer periphery of the bearing surface of the nut 103.

Hereinafter, a method for using the mold device in the present fifth embodiment will be described. First, the insert electrode 102 is disposed in the mold body 104. At this time, the insert electrode 102 is disposed so that the protrusion 104e penetrates the insert hole 102a of the insert electrode 102. Next, a screw hole 103a of the nut 103 is fitted onto the protrusion 104e with the insert electrode 102 interposed.

Next, the first and second molds 301a, 301b of the slide mold 301 are rotated in arrow directions in FIGS. 8 and 10, and the outer periphery of the bearing surface of the nut 103 (the abutting surface 103b) is enclosed by the pair of cutouts 30. Resin is injected into a cavity 105 of the mold body 104 to resin-seal the semiconductor device. After the resin is cured, the resin-sealed insert electrode 102 and nut 103 are separated from the mold body 104. By the above-described process, the resin-sealed semiconductor device is obtained.

<Effects>

The mold device in the present fifth embodiment is a mold device to resin-seal the semiconductor device including the insert electrode 102, and in the semiconductor device, the insert electrode 102 is provided with the insert hole 102a, the nut 103 having the screw hole 103a is disposed in the insert electrode 102 so that the insert hole 102a and the screw hole 103a communicate with each other, the mold device includes the mold body 104 into which the resin is injected to resin-seal the semiconductor device, including the side of the insert electrode 102 where the nut 103 is disposed, and the slide mold 301 disposed on the inner side of the insert electrode 102, the mold body 104 includes the protrusion 104e, the protrusion 104e is inserted into the screw hole 103a of the nut 103 through the insert hole 102a of the insert electrode 102, the slide mold 301 includes the first and second molds 301a, 301b, the respective first and second molds 301a, 301b are provided with the pair of cutouts 30, and the pair of cutouts 30 encloses the outer periphery of the bearing surface of the nut 103.

In the present fifth embodiment, when the resin is injected into the mold body 104, the cutouts 30 provided in the first and second molds 301a, 301b enclose the outer periphery of the bearing surface of the nut 103. Thereby, when the resin scaling is performed, the resin is dammed by the first and second molds 301a, 301b, so that the resin can be restrained from entering between the insert electrode and the bearing surface of the nut 103.

Moreover, in the mold device in the present fifth embodiment, the first and second molds 301a, 301b have the same rotating shaft 301c, and the first and second molds 301a, 301b rotate with respect to the rotating shaft 301c to switch between the state where the pair of cutouts 30 encloses the outer periphery of the bearing surface of the nut 103, and the state where the pair of cutouts 30 releases the enclosure of the outer periphery of the bearing surface of the nut 103.

Accordingly, the first and second molds 301a, 301b coupled by the same rotating shaft 301c are rotated to easily enclose the outer periphery of the bearing surface of the nut 103.

Modification of Embodiment 5

Figure 12:
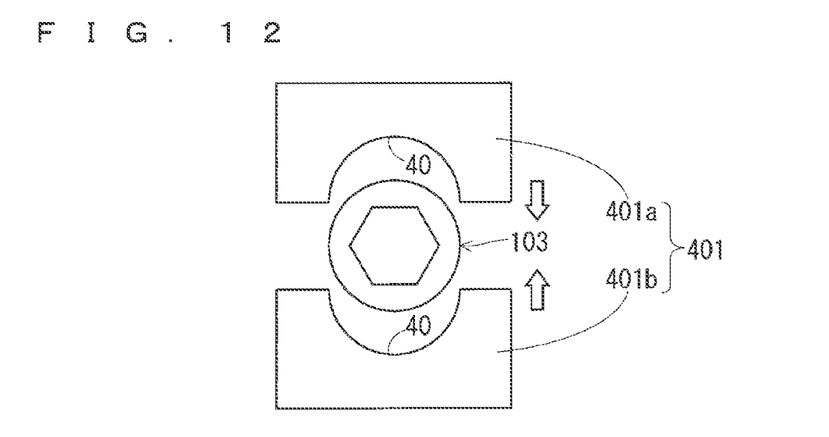
FIG. 12 is a plan view of a slide mold of a mold device according to a modification of the fifth embodiment.

FIGS. 12 and 13 are plan views of a slide mold 401 in a modification of the fifth embodiment. In the present modification, the slide mold 401 is made up of first and second molds 401a, 401b. As shown in FIG. 12, the first and second molds 401a, 401b are provided with a pair of cutouts 40, respectively.

Figure 13:
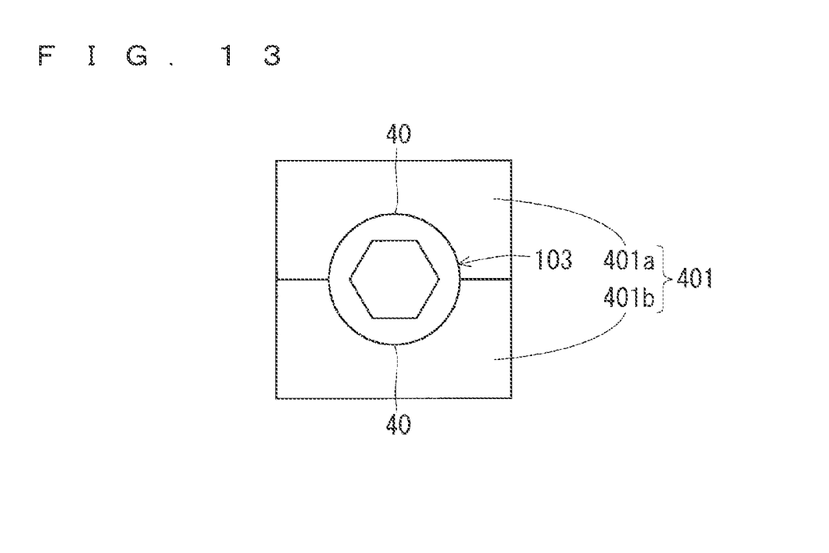
FIG. 13 is a plan view of the slide mold of the mold device according to the modification of the fifth embodiment.

As shown in FIG. 13, the separated first and second molds 401a, 401b enclose the outer periphery of the bearing surface of the nut 103. In the present modification as well, when the resin sealing is performed, the resin is dammed by the first and second molds 401a, 401b, so that it is possible to obtain the effect that the resin can be restrained from entering between the insert electrode and the bearing surface of the nut 103.

Embodiment 6

Figure 14:
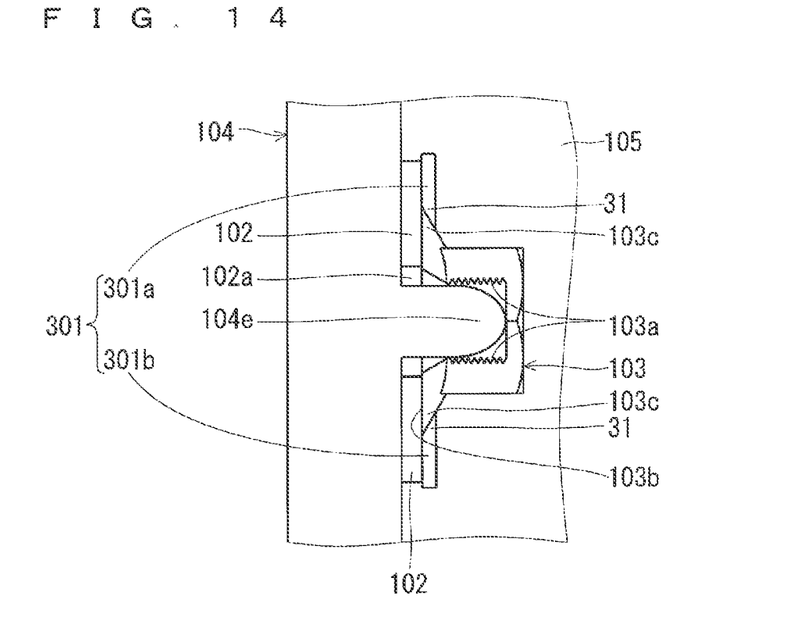
FIG. 14 is a cross-sectional view of a mold device according to a sixth embodiment.

FIG. 14 is a cross-sectional view of a mold device in the present sixth embodiment. In the present sixth embodiment, the shapes of the slide mold 301 and the nut 103 in the fifth embodiment are changed.

As shown in FIG. 14, in the present sixth embodiment, in an outer periphery (an outer periphery of a fringe of a nut 103) of a bearing surface (an abutting surface 103b) of the nut 103, an inclination 103c is provided. Moreover, in a pair of cutouts 30 (refer to FIGS. 10 and 14), inclinations 31 that fit in the inclination 103c in the outer periphery of the bearing surface of the nut 103 are provided.

Figure 15:
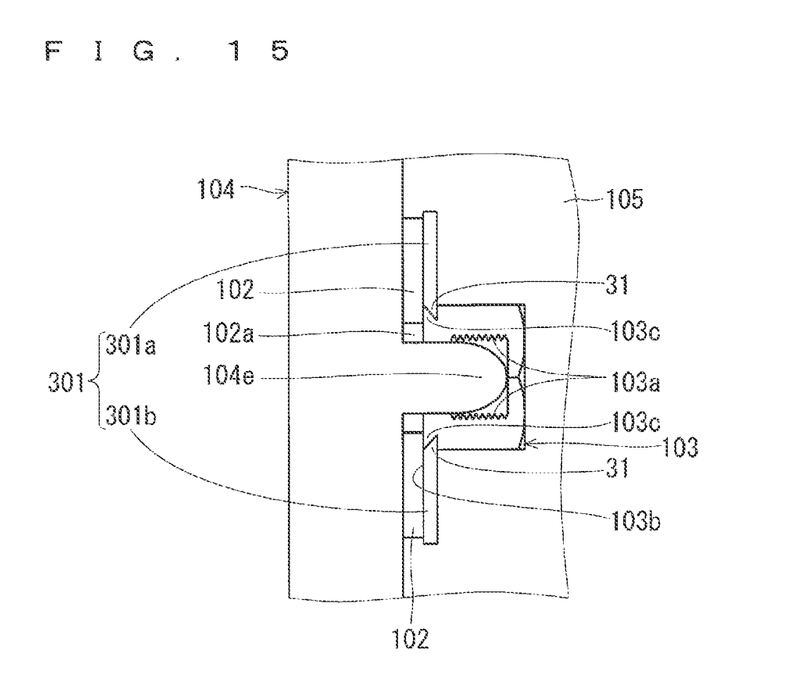
FIG. 15 is a cross-sectional view of the mold device according to the sixth embodiment.

While in FIG. 14, the nut 103 having the fringe has been described, the nut 103 not having the fringe may be employed. In this case, as shown in FIG. 15, a groove having the inclination 103c is provided in an outer periphery of a body of the nut 103.

<Effects>

In the mold device in the present sixth embodiment, in the outer periphery of the bearing surface of the nut 103 to be enclosed by the pair of cutouts 30, the inclination 103c spread toward the bearing surface (the abutting surface 103b) is provided, and in the pair of cutouts 30, the inclinations 31 that fit in the inclination 103c of the outer periphery of the bearing surface of the nut 103 are provided.

In the present sixth embodiment, when the outer periphery of the nut 103 is enclosed by the slide mold 301, the inclinations 31 provided in the pair of cutouts 30 press the inclination 103c provided in the outer periphery of the bearing surface of the nut 103 to the side of the insert electrode 102. Thus, in addition to the effects described in the fifth embodiment, the slide mold 301 can be provided with a function of adjusting the nut 103 to a predetermined position. Further, since a force in a direction where the nut 103 is pressed to the side of the insert electrode 102 acts, a gap which resin enters can be restrained from occurring between the nut 103 and an inner side of the insert electrode 102.

Embodiment 7

Figure 16:
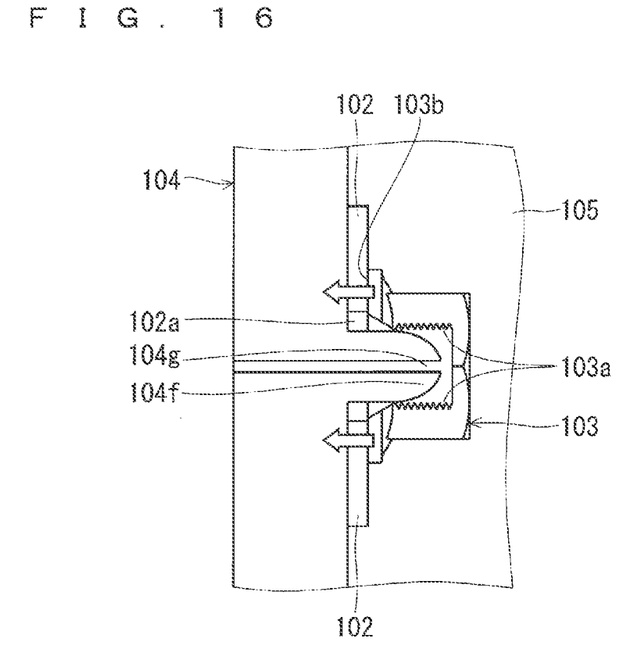
FIG. 16 is a cross-sectional view of a mold device according to a seventh embodiment.

FIG. 16 is a cross-sectional view of a mold device according to a seventh embodiment. The mold device in the present seventh embodiment is a mold device to resin-seal a semiconductor device including an insert electrode 102. As shown in FIG. 16, the insert electrode 102 is provided with an insert hole 102a. In the insert electrode 102, a nut 103 having a screw hole 103a is disposed. The nut 103 is disposed so that the insert hole 102a and the screw hole 103a communicate with each other.

The mold device in the present seventh embodiment includes a mold body 104 into which resin is injected to resin-seal a semiconductor device, including a side of the insert electrode 102 where the nut 103 is disposed, and a protrusion 104f provided in the mold body 104.

Here, the protrusion 104f is a pilot pin. The protrusion 104f is provided with an adsorption passage 104g. One end of the adsorption passage 104g connects to a negative pressure source not shown outside the mold body 104. Another end of the adsorption passage 104g penetrates a leading end of the protrusion 104f.

In the present seventh embodiment, the nut 103 is a cap nut (a non-penetration type nut).

Hereinafter, a method for using the mold device in the present seventh embodiment will be described. First, the insert electrode 102 is disposed in the mold body 104. At this time, the insert electrode 102 is disposed so that the protrusion 104f penetrates the insert hole 102a of the insert electrode 102. Next, the screw hole 103a of the nut 103 is fitted onto the protrusion 104f with the insert electrode 102 interposed.

In this state, the negative pressure source not shown and connecting to the one end of the adsorption passage 104g is operated. This allows the nut 103 fitted in the leading end of the protrusion 104f to be adsorbed due to a negative pressure. The nut 103 adsorbed due to the negative pressure is drawn to a side of the insert electrode 102. That is, the nut 103 is drawn in an arrow direction in FIG. 16. As a result, an abutting surface 103b of the nut 103 is caused to closely adhere to an inner side of the insert electrode 102 without any gap.

When the nut 103 is adsorbed, foreign subjects (dust and the like) inside the screw hole 103a of the nut 103 and between the abutting surface 103b of the nut 103 and the insert electrode 102 are sucked outside.

In the state where the nut 103 is adsorbed by the adsorption passage 104g, resin is injected into a cavity 105 of the mold body 104. After the resin is cured, the resin-sealed insert electrode 102 and nut 103 are separated from the mold body 104. By the above-described process, the resin-sealed semiconductor device is obtained.

<Effects>

The mold device in the present seventh embodiment is a mold device to resin-seal the semiconductor device including the insert electrode 102, and in the semiconductor device, the insert electrode 102 is provided with the insert hole 102a, the nut 103 having the screw hole 103a is disposed in the insert electrode 102 so that the insert hole 102a and the screw hole 103a communicate with each other, the mold device includes the mold body 104 into which the resin is injected to resin-seal the semiconductor device, including the side of the insert electrode 102 where the nut 103 is disposed, and the protrusion 104f provided in the mold body 104, the protrusion 104f is inserted into the screw hole 103a of the nut 103 through the insert hole 102a of the insert electrode 102, and the protrusion 104f is provide with the adsorption passage 104g that adsorbs the nut 103 due to the negative pressure to draw the nut 103 to the side of the insert electrode 102.

In the present seventh embodiment, when resin is injected into the mold body 104, the nut 103 is adsorbed by the adsorption passage 104g with the insert electrode 102 interposed. The adsorption of the nut 103 allows the nut 103 to be drawn to the side of the insert electrode 102, so that the insert electrode 102 and the nut 103 are caused to closely adhere without any gap. That is, a gap which the resin enters can be restrained from occurring between the nut 103 and the inner side of the insert electrode 102.

Embodiment 8

Figure 17:
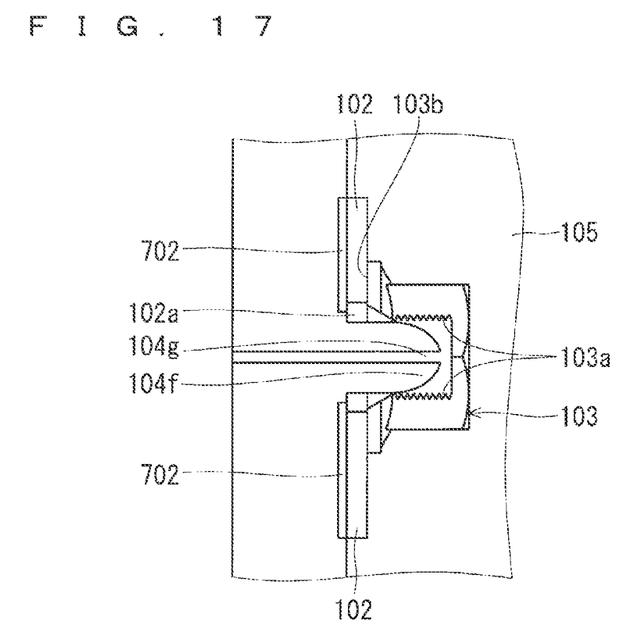
FIG. 17 is a cross-sectional view of a mold device according to an eighth embodiment.

FIG. 17 is a cross-sectional view of a mold device according to an eighth embodiment. In the present eighth embodiment, in addition to the configuration of the seventh embodiment, an O-ring 702 is provided between a mold body 104 and an insert electrode 102. That is, a groove is provided in the mold body 104 so as to surround a circumference of a protrusion 104f of the mold body 104 to embed the O-ring 702 in the groove. The O-ring 702 is made of, for example, silicon resin having thermal resistance.

<Effects>

The mold device in the present eighth embodiment further includes the O-ring 702 surrounding the protrusion 104f. Accordingly, when a nut 103 is adsorbed by an adsorption passage 104g, failure of adsorption can be suppressed. Thus, the nut 103 is adsorbed more reliably, and the nut 103 can be drawn to a side of the insert electrode 102 more strongly.

While the present invention has been described in detail, the foregoing description is illustrative in all the aspects, and the present invention is not limited thereto. It is understood that numerous modifications not illustrated can be assumed without departing from the scope of the present invention.

EXPLANATION OF REFERENCE SIGNS

101: bolt
102: insert electrode
102a: insert hole
103: nut
103a: screw hole
103b: abutting surface
103c: inclination
104: mold body
104a: recession
104b, 104c, 104d: through hole
104e, 104f: protrusion
104g: adsorption passage
105: cavity
201: pilot pin
201a: screw hole
301, 401: slide mold
301a, 401a: first mold
301b, 401b: second mold
301c: rotating shaft
502, 503, 602, 603: pilot pin
501, 601: pilot pin extension rod
502a, 503a, 602a, 603a: claw
702: O-ring
30, 40: cutout
31: inclination

The invention claimed is:

1. A mold device to resin-seal a semiconductor device including an insert electrode, wherein
in said semiconductor device, said insert electrode is provided with an insert hole, and a nut having a screw hole is disposed in said insert electrode so that said insert hole and said screw hole communicate with each other,
said mold device comprises:
a mold body into which resin is injected to resin-seal said semiconductor device, including a side of said insert electrode where said nut is disposed; and
a rod-like member that is inserted into said insert hole, and
said rod-like member is inserted into said screw hole of said nut through said insert hole of said insert electrode to draw the nut to the side of said insert electrode,
said rod-like member is a plurality of pilot pins,
a claw is provided at a leading end of each of said plurality of pilot pins,
a pilot pin extension rod is further included,
in a state where said plurality of pilot pins are inserted into said screw hole of said nut through said insert hole, said pilot pin extension rod is inserted between said plurality of pilot pins, by which said claws of said plurality of pilot pins are locked in said nut, and
in a state where said claws of said plurality of pilot pins are locked in said nut, said plurality of pilot pins draw said nut to the side of said insert electrode.

2. The mold device according to claim 1, wherein
said nut is a nut with both ends of said screw hole penetrated, and
said claws of said pilot pins lock a surface of said nut on an opposite side of an entrance side from which said pilot pins are inserted.

3. The mold device according to claim 1, wherein
said nut is a cap nut, and
said claws of said pilot pins lock an inner wall surface of said screw hole of said nut.

4. A mold device to resin-seal a semiconductor device including an insert electrode, wherein
in said semiconductor device, said insert electrode is provided with an insert hole, and a nut having a screw hole is disposed in said insert electrode so that said insert hole and said screw hole communicate with each other,
said mold device comprises:
a mold body into which resin is injected to resin-seal said semiconductor device, including a side of said insert electrode where said nut is disposed; and
a slide mold disposed on an inner side of said insert electrode,
said mold body includes a protrusion,
said protrusion is inserted into said screw hole of said nut through said insert hole of said insert electrode,
said slide mold includes first and second molds,
in said respective first and second molds, a pair of cutouts is provided, and
said pair of cutouts encloses an outer periphery of a bearing surface of said nut.

5. The mold device according to claim 4, wherein
said first and second molds have a same rotating shaft, and
said first and second molds rotate with respect to said rotating shaft to switch between a state where said pair of cutouts encloses the outer periphery of the bearing surface of said nut, and a state where said pair of cutouts releases the enclosure of the outer periphery of the bearing surface of said nut.

6. The mold device according to claim 4, wherein
in the outer periphery of the bearing surface of said nut enclosed by said pair of cutouts, an inclination spread toward the bearing surface is provided, and
in said pair of cutouts, inclinations that fit in the inclination of the outer periphery of the bearing surface of said nut are provided.

7. A mold device to resin-seal a semiconductor device including an insert electrode, wherein
in said semiconductor device, said insert electrode is provided with an insert hole, and a nut having a screw hole is disposed in said insert electrode so that said insert hole and said screw hole communicate with each other,
said mold device comprises:
a mold body into which resin is injected to resin-seal said semiconductor device, including a side of said insert electrode where said nut is disposed; and
a protrusion provided in said mold body,
said protrusion is inserted into said screw hole of said nut through said insert hole of said insert electrode, and
said protrusion is provided with an adsorption passage that adsorbs said nut due to a negative pressure to draw said nut to the side of said insert electrode, and the adsorption passage bisects the protrusion in an axial direction of the protrusion.

8. The mold device according to claim 7, further comprising an O-ring that surrounds said protrusion.

9. A mold device to resin-seal a semiconductor device including an insert electrode, wherein in said semiconductor device, said insert electrode is provided with an insert hole, and a nut having a screw hole is disposed in said insert electrode so that said insert hole and said screw hole communicate with each other, said mold device comprises a mold body into which resin is injected to resin-seal said semiconductor device, including a side of said insert electrode where said nut is disposed, and said mold body is provided with a recession to receive a head portion of a bolt that is screwed into said screw hole of said nut through said insert hole, wherein the mold body includes a through hole on a side of the insert electrode opposite the nut for inserting the rod-like member into the mold body.

* * * * *